United States Patent
Gongwer et al.

(10) Patent No.: US 6,738,289 B2
(45) Date of Patent: May 18, 2004

(54) NON-VOLATILE MEMORY WITH IMPROVED PROGRAMMING AND METHOD THEREFOR

(75) Inventors: Geoffrey Gongwer, Los Altos, CA (US); Daniel C. Guterman, Fremont, CA (US)

(73) Assignee: SanDisk Corporation, Sunnyvale, CA (US)

( * ) Notice: Subject to any disclaimer, the term of this patent is extended or adjusted under 35 U.S.C. 154(b) by 125 days.

(21) Appl. No.: 09/793,370

(22) Filed: Feb. 26, 2001

(65) Prior Publication Data

US 2002/0118574 A1 Aug. 29, 2002

(51) Int. Cl.[7] .............................................. G11C 16/04
(52) U.S. Cl. ............................... 365/185.12; 365/185.11
(58) Field of Search ........................ 365/185.28, 185.01, 365/185.26, 185.19, 185.22, 185.11, 185.12

(56) References Cited

U.S. PATENT DOCUMENTS

| | | | |
|---|---|---|---|
| 4,628,487 A | | 12/1986 | Smayling |
| 5,172,338 A | * | 12/1992 | Mehrotra et al. ....... 365/185.03 |
| 5,218,569 A | * | 6/1993 | Banks ................... 365/185.21 |
| 5,220,531 A | | 6/1993 | Blyth et al. ............ 365/189.07 |
| 5,239,505 A | * | 8/1993 | Fazio et al. ............ 365/185.02 |
| 5,422,842 A | | 6/1995 | Cernea et al. |
| 5,557,567 A | | 9/1996 | Bergemont et al. |
| 5,602,789 A | * | 2/1997 | Endoh et al. .......... 365/185.03 |
| 5,623,436 A | | 4/1997 | Sowards et al. ............. 365/45 |
| 5,677,869 A | | 10/1997 | Fazio et al. ............ 365/185.03 |
| 5,729,489 A | | 3/1998 | Fazio et al. ............ 365/185.03 |
| 5,754,470 A | | 5/1998 | Engh et al. ............ 365/185.03 |
| 5,764,571 A | * | 6/1998 | Banks .................... 365/189.01 |
| 5,768,192 A | | 6/1998 | Eitan ..................... 365/185.24 |
| 5,784,315 A | | 7/1998 | Itoh ...................... 365/185.22 |
| 5,796,652 A | | 8/1998 | Takeshima et al. |
| 5,801,989 A | | 9/1998 | Lee et al. .............. 365/185.22 |
| 5,831,903 A | * | 11/1998 | Ohuchi et al. ......... 365/185.22 |
| 5,923,588 A | | 7/1999 | Iwahashi ............... 365/185.24 |
| 5,926,409 A | | 7/1999 | Engh et al. ................... 365/45 |

(List continued on next page.)

OTHER PUBLICATIONS

Chi, Min–hwa et al., "Low–Voltage Multi–level Flash Memory: Determination of Minimum Spacing Between Multi–levels," Semiconductor Electronics, 1996, ICSE 1996 Proceedings, 1996 IEEE International Conference Penang, Malaysia, Nov. 26, 1996, pp. 1–5.

(List continued on next page.)

Primary Examiner—Matthew Smith
Assistant Examiner—Lex H. Malsawma
(74) Attorney, Agent, or Firm—Parsons Hsue & de Runtz LLP

(57) ABSTRACT

Non-volatile memory that has non-volatile charge storing capability such as EEPROM and flash EEPROM is programmed by a programming system that applies to a plurality of memory cells in parallel. Enhanced performance is achieved by programming each cell to its target state with a minimum of programming pulses using a data-dependent programming voltage. Further improvement is accomplished by performing the programming operation in multiphase where each successive phase is executed with a finer programming resolution such as employing a programming voltage with a gentler staircase waveform. These features allow rapid and accurate convergence to the target states for the group of memory cells being programmed in parallel, thereby allowing each cell to store several bits of information without sacrificing performance.

18 Claims, 10 Drawing Sheets

U.S. PATENT DOCUMENTS

| | | | | |
|---|---|---|---|---|
| 5,986,929 | A | * 11/1999 | Sugiura et al. | 365/185.03 |
| 6,011,725 | A | 1/2000 | Eitan | 365/185.33 |
| 6,014,327 | A | * 1/2000 | Banks | 365/185.03 |
| 6,014,330 | A | 1/2000 | Endoh et al. | |
| 6,040,993 | A | 3/2000 | Chen et al. | 365/185.03 |
| 6,046,934 | A | 4/2000 | Lin | 365/185.03 |
| 6,097,639 | A | * 8/2000 | Choi et al. | 365/185.28 |
| 6,134,148 | A | 10/2000 | Kawahara et al. | |
| 6,266,270 | B1 | 7/2001 | Nobukata | |
| 6,317,364 | B1 | * 11/2001 | Guterman et al. | 365/185.28 |
| 6,373,747 | B1 | * 4/2002 | Harari et al. | 365/185.09 |

OTHER PUBLICATIONS

Chi, Min–hwa et al., "Multi–level Flash/EPROM Memories: New Self–convergent Programming Methods for Low–voltage Applications," Electron Devices Meeting, Dec.10, 1995, pp. 271–274.

Ohkawa, Masayoshi et al., "A 98mm$^2$ 3.3V 64Mb Flash Memory with FN–NOR Type 4–level Cell," IEEE International Solid–State Circuits Conference, Feb. 8, 1996, pp. 36–37 and 413.

International Search Report in counterpart PCT application PCT/US02/05265, Dec. 3, 2002, 5pages.

* cited by examiner

NON-VOLATILE MEMORY WITH IMPROVED PROGRAMMING AND METHOD THEREFOR

FIELD OF THE INVENTION

This invention relates generally to non-volatile semiconductor memory such as electrically erasable programmable read-only memory (EEPROM) and flash EEPROM, and specifically to circuits and techniques for programming their memory states.

BACKGROUND OF THE INVENTION

Solid-state memory capable of nonvolatile storage of charge, particularly in the form of EEPROM and flash EEPROM, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory is ideally suited in the mobile and handheld environment because of its small size, low power consumption, high speed and high reliability features.

EEPROM and electrically programmable read-only memory (EPROM) are nonvolatile memory that can be erased and have new data written or "programmed" into their memory cells.

An EPROM utilizes a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charge and therefore an EPROM memory cell can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

For EPROM memory, the transistor serving as a memory cell is typically programmed to a programmed state by accelerating electrons from the substrate channel region, through a thin gate dielectric and onto the floating gate. The memory is bulk erasable by removing the charge on the floating gate by ultraviolet radiation.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for adding and removing charge electrically from its floating gate upon application of proper voltages without the need for exposure to UV radiation.

An array of such EEPROM cells is referred to as a "Flash" EEPROM array when an entire array of cells, or significant group of cells of the array, is electrically erased together (i.e., in a flash). Once erased, the group of cells can then be reprogrammed.

FIG. 1B illustrates schematically a non-volatile memory in the form of a NROM cell with a dielectric layer for storing charge. Instead of storing charge in a floating gate, it has a dielectric layer for storing charge. For example, U.S. Pat. Nos. 5,768,192 and 6,011,725 disclose a nonvolatile memory cell having a trapping dielectric sandwiched between two silicon dioxide layers.

Cell and Array Structure

FIG. 1C illustrates schematically a flash EEPROM cell having both a select gate and a control or steering gate. Memory devices having such a cell structure are described in U.S. Pat. No. 5,313,421, which patent is incorporated herein by reference. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The control gate will also be referred to as a steering gate 30. The floating gate is capable of storing a selectable amount of charge. The amount of current that can flow through the T1's portion of the channel depends on the voltage on the steering gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain.

FIG. 1D illustrates schematically another flash EEPROM cell having dual floating gates and independent select and control gates. Memory devices having such a cell structure are described in co-pending U.S. patent application Ser. No. 09/343,493, filed Jun. 30, 1999, which disclosure is incorporated herein by reference. The memory cell 10' is similar to that of FIG. 1C except it effectively has three transistors in series. Between a pair of memory transistors, T1-left and T1-right, is a select transistor T2. The memory transistors have floating gates 20' and 20" and steering gates 30' and 30" respectively. The select transistor T2 is controlled by a control gate 40'. At any one time, only one of the pair of memory transistors is accessed for read or program. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 2 is a schematic block diagram of an addressable array of memory cells in rows and columns with decoders. A two-dimensional array of memory cells 100 is formed, with each row of memory cells connecting by their sources and drains in a daisy-chain manner. Each memory cell 50 has a source 54, a drain 56 and a steering gate 60 and a select gate 70. The cells in a row have their select gates connected to a word line 110. The cells in a column have their sources and drains respectively connected to bit lines 124, 126. The cells in a column also have their steering gates connected by a steering line 130.

When the cell 50 is addressed for programming or reading, appropriate programming or reading voltages ($V_S$, $V_D$, $V_{STG}$, $V_{SLG}$) must be supplied respectively to the cell's source 54 and drain 56, steering gate 60 and select gate 70. A word line decoder 112 selectively connects a selected word line to a select voltage $V_{SLG}$. A bit line decoder 122 selectively connects the pair of bit lines 124, 126 in an addressed column respectively to source voltage $V_S$ and drain voltage $V_D$. Similarly, a steering line decoder 132 selectively connects the steering line 130 in the addressed column to a steering or control gate voltage $V_{STG}$.

Thus, a specific cell of the two-dimensional array of flash EEPROM cells is addressed for programming or reading by a selection or decode in the column direction of a pair of bit lines and a steering line, and in the row direction of a word line. In order to increase performance, the column decoders 122 and 132 allow a group of columns to be selected, and therefore a corresponding group or chunk of cells to be accessed in parallel, thereby accessing the row of cells chunk-by-chunk.

Previously, many flash EEPROM devices have had a word line connecting all the control gates of cells along each row. Thus, the word line essentially performs two functions: row selection; and supplying control gate voltage to all cells in the row for reading or programming. It is often difficult to perform both of these functions in an optimum manner with a single voltage. If the voltage is sufficient for row selection, it may be higher than desirable for programming. However, with a cell having independent steering gate and select gate, the word line which is connected to the select gates of cell in a row need only perform the selection function while the steering line performs the function of supplying optimum, independent control gate voltage to individual cells in a column.

Cell Characteristics

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level or $I_{REF}$, the cell is determined to be in one logical state (e.g., a "zero" state), while if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to determine the threshold voltage at the control gate that causes the conduction current to just "trip" or transverse a fixed reference current. Thus, the detection is performed on a threshold voltage among a partitioned threshold voltage window.

FIG. 3 illustrates the relation between the source-drain current $I_D$ and the control gate voltage $V_{STG}$ for four different charges Q1–Q4 that the floating gate may be selectively storing at any one time. The four solid $I_D$ versus $V_{STG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{STG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

SUMMARY AND OBJECTS OF THE INVENTION

Accordingly, it is a general object of the present invention to provide high density and high performance, yet low cost memory device.

In particular, it is a general object of the present invention to provide high performance flash EEPROM that can support memory states substantially greater than two.

It is another general object of the present invention to provide flash EEPROM semiconductor chips that can replace magnetic disk storage devices in computer systems.

It is an object of the present invention to provide improved programming circuits and methods for flash EEPROM devices.

It is also an object of the invention to provide programming circuits that are simpler and easier to manufacture and have improved accuracy and reliability over an extended period of use.

These and additional objects are accomplished by improvements in programming circuits and techniques for nonvolatile floating gate devices. Various aspects of the present invention help to increase performance while achieving the required fine programming resolution. One feature of the present invention is to use programming pulses with magnitudes optimized for the data to be programmed (target state) so that within the first step or first few steps, the cell is programmed as close to the target state as possible without overshooting. A second feature is to iterate the programming through a series of operation phases, where with each phase the programming waveform produces increasing finer programming steps. Another feature is to implement the first two features in a programming operation applicable to a group of cells in parallel. In this way, both high resolution and rapid convergence to the target state can be achieved at the same time while parallel operation further improves performance.

According to one aspect of the invention, in a memory device with multistate cells, the improvement includes a programming circuit and method that can be applied to a group of memory cells in parallel. The programming pulses applied to each of the cells in parallel are optimized for the data to be stored in that cell. In this way, each of the cells is programmed to its target state with a minimum of programming pulses. In the preferred embodiment, this is accomplished by provision of a programming voltage bus supplying a plurality of voltage levels and the programming circuit for each cell in the group able to select from the voltage bus an optimum voltage level appropriate for programming each cell to its target state.

According to another aspect of the invention, the programming pulses are applied over a plurality of programming operation phases, with increasingly finer programming resolution. In the preferred embodiment, during each phase, a programming voltage in the form of a staircase waveform is applied to each of the cells in parallel. A cell in the group is excluded from further programming when it has been programmed to pass a predetermined level offset short of the target level corresponding to the target state. The offset is such that a programming pulse that programs a cell past the predetermined level does not overshoot the target level by more than a predetermined margin. The predetermined margin is implicitly set by the size of the programming steps. During the last phase, the predetermined level is the same as the target level with the offset being zero. In this way, rapid convergence to the target state is possible while achieving high resolution.

The improved programming circuits and techniques allow the range of conduction states or threshold voltages of the cell to be finely partitioned to support higher density storage. In the preferred embodiment, a flash EEPROM cell with 16 distinct states can be programmed within about 10–20 programming steps. When the improved features of data-dependent programming voltages and multiphase programming are implemented in a massively parallel operation, a high density and high performance, yet low cost flash EEPROM is possible.

Additional objects, features and advantages of the present invention will be understood from the following description of its preferred embodiments, which description should be taken in conjunction with the accompanying drawings.

DESCRIPTION OF THE PREFERRED EMBODIMENTS

Figure 1A:
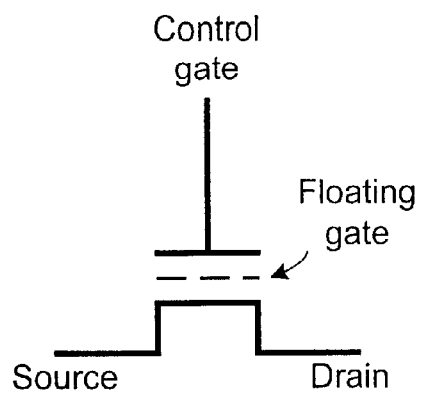
FIG. 1A illustrates schematically a non-volatile memory in the form of an EEPROM cell.
Figure 1B:
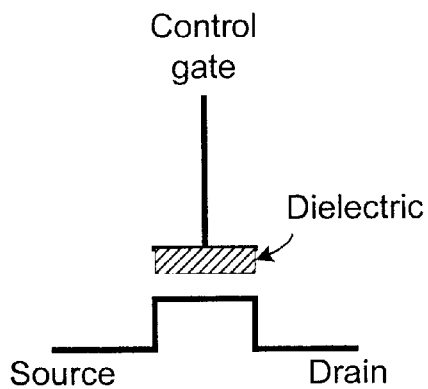
FIG. 1B illustrates schematically a non-volatile memory in the form of a NROM cell.
Figure 1C:
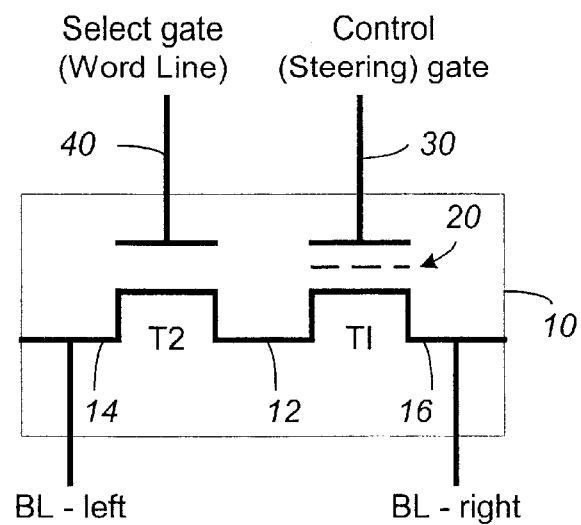
FIG. 1C illustrates schematically a flash EEPROM cell having both a select gate and a control or steering gate.
Figure 1D:
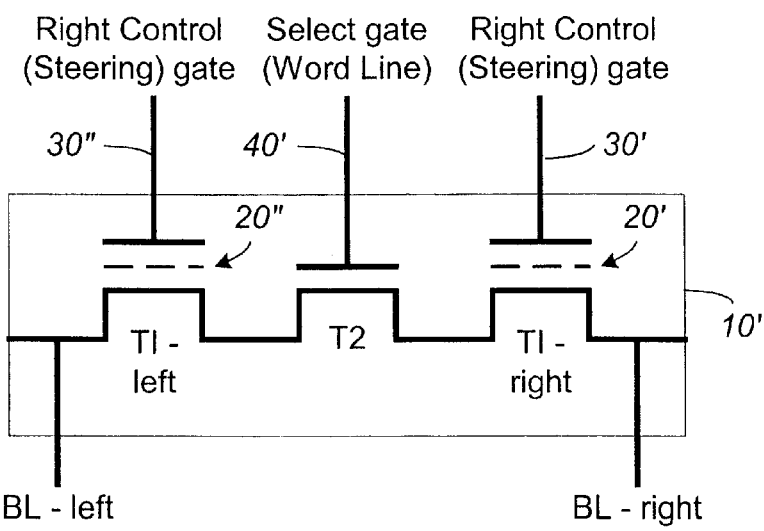
FIG. 1D illustrates schematically another flash EEPROM cell having dual floating gates and independent select and control gates.
Figure 2:
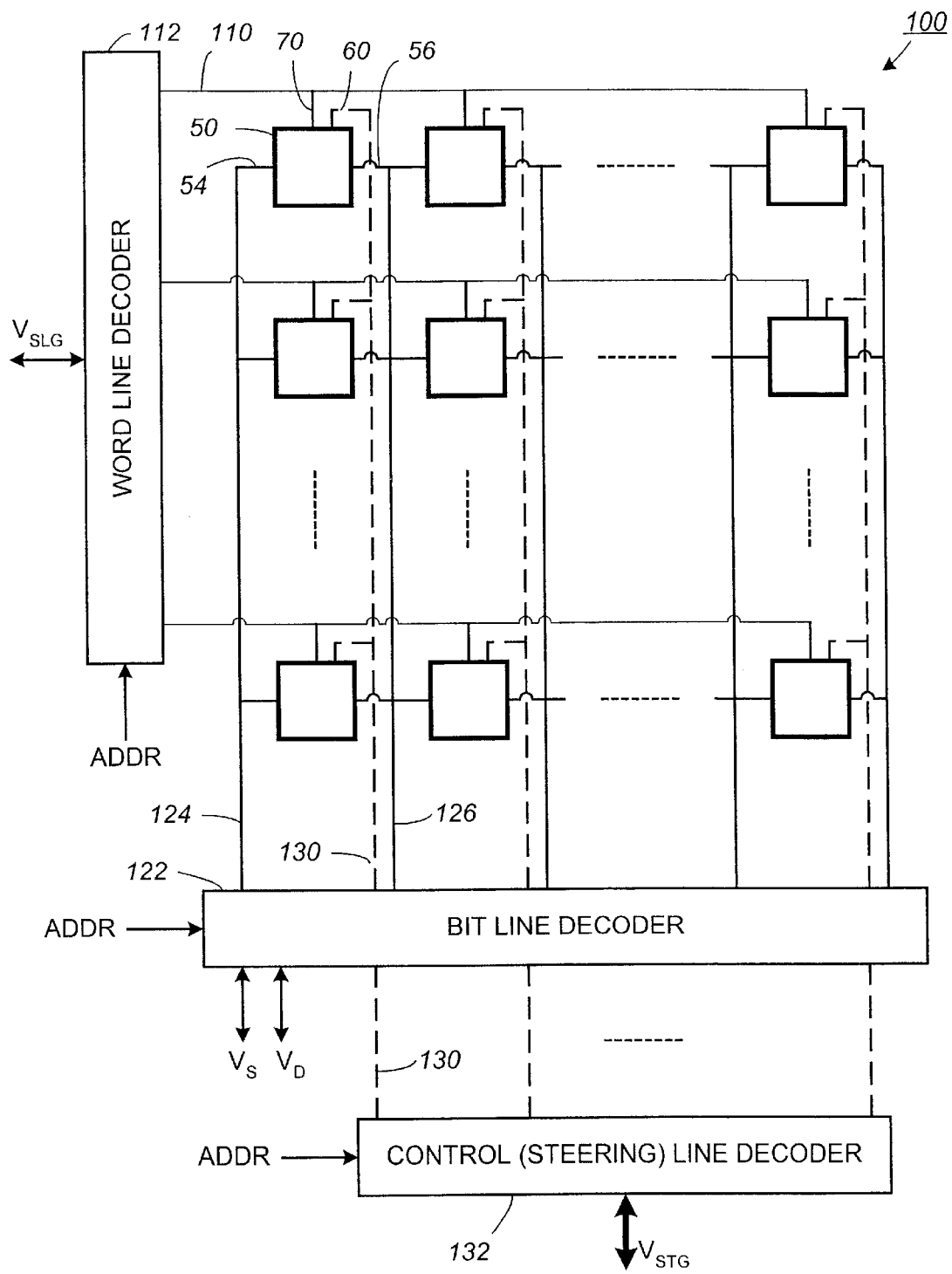
FIG. 2 is a schematic block diagram of an addressable array of memory cells in rows and columns with decoders.
Figure 3:
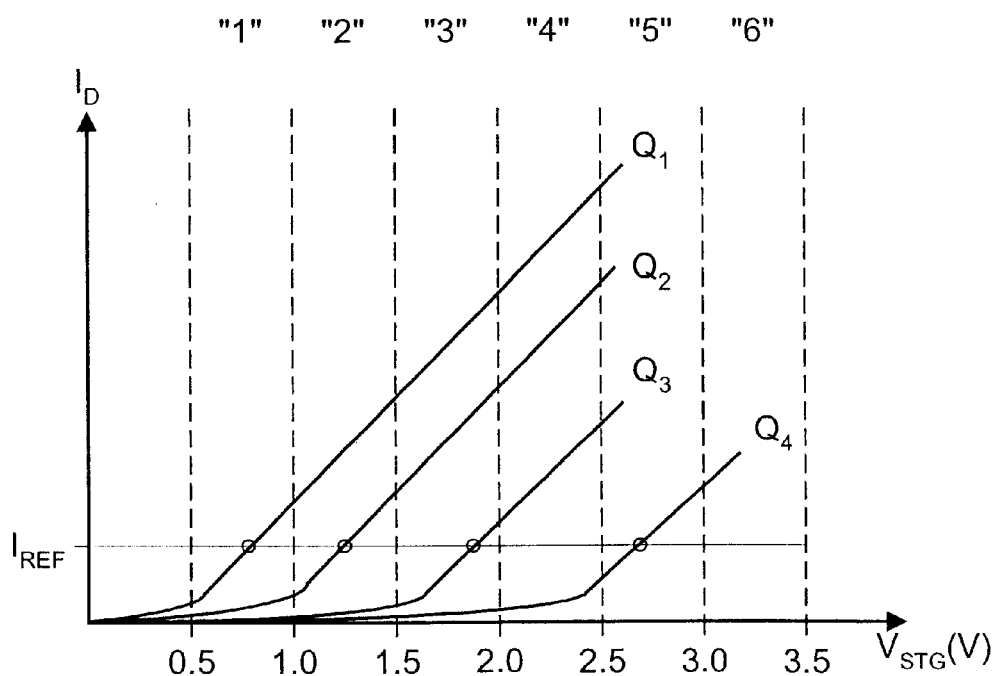
FIG. 3 illustrates the relation between the source-drain current I(t) and the control gate voltage $V_{STG}$ for four different charges Q1–Q4 that the floating gate may be storing at any one time.
Figure 4:
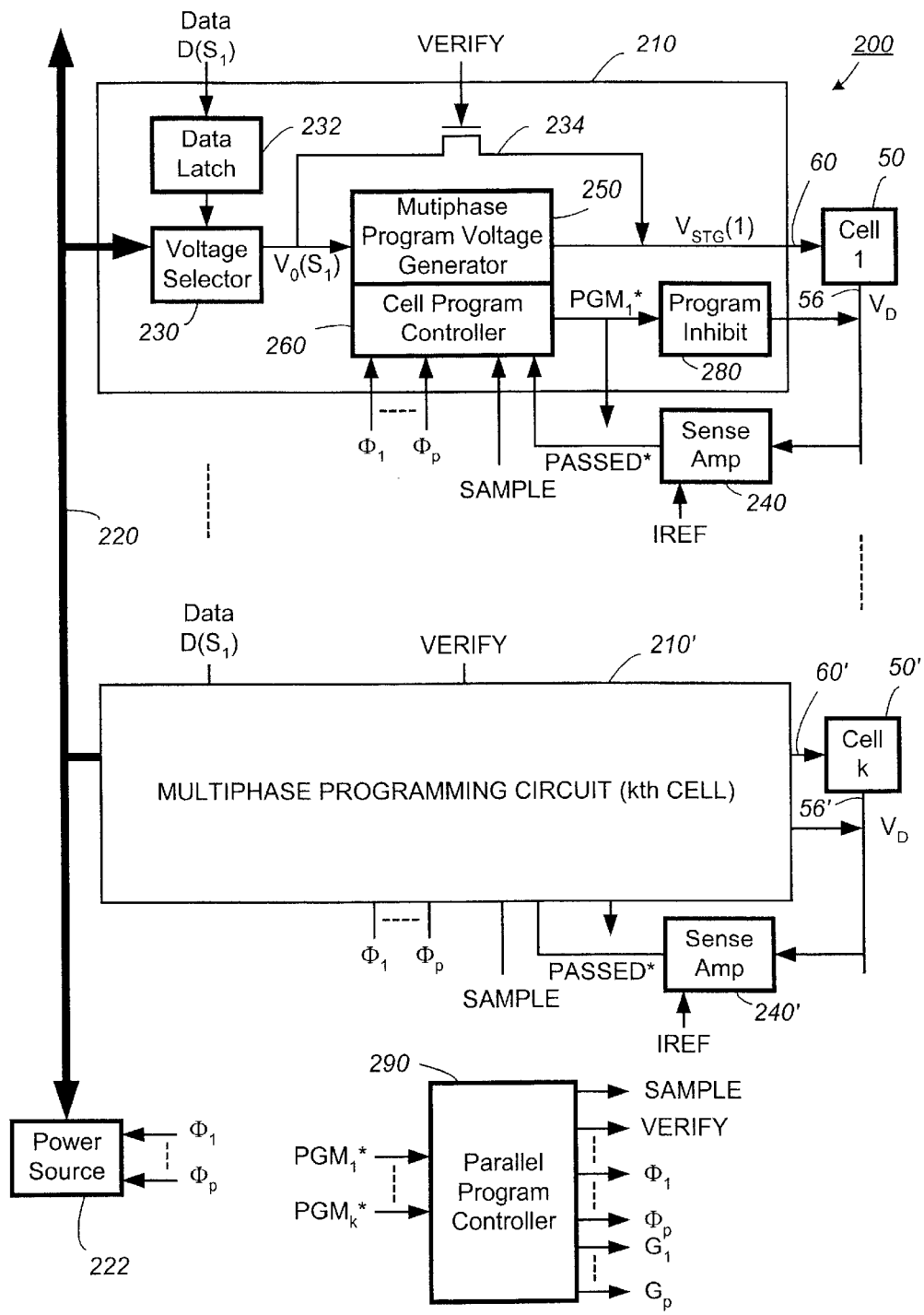
FIG. 4 is a block diagram illustrating a programming system for programming a group of memory cells in parallel, according to a preferred embodiment of the present invention.

FIG. 4 is a block diagram illustrating a programming system for programming a group of memory cells in parallel, according to a preferred embodiment of the present invention. The programming system 200 comprises a bank of multiphase programming circuits 210, . . . , 210' for supplying optimized individual programming voltages $V_{STG}(1)$, . . . , $V_{STG}(k)$ to the steering gates 60, . . . , 60' of a group of k memory cells, 50, . . . , 50'. In one preferred embodiment, a chunk size of k=4096 cells is programmed in parallel.

The multiphase programming circuit 210 essentially supplies a series of programming voltage pulses to the steering gate of cell 50. When the cell 50 is to be programmed to a target state $S_1$, the supplied voltage pulses are optimized to program the cell to $S_1$ accurately and quickly. In one preferred embodiment, the threshold window of each cell 50 is partitioned to designate one of sixteen states. For example, a cell spanning a threshold voltage window between 0.5–3.5V would require partitioning into approximately 0.2V intervals to demarcate 16 states. This is approximately one order of magnitude higher than the resolution used in a 2-state partitioning.

A multi-voltage bus 220 is driven by a power supply 222 to provide a plurality of optimum starting voltages $V_0$, for programming and reading the partitioned states. In general, the more voltages available, the finer is the optimization of the starting voltages. In the preferred embodiment, the multi-voltage bus will supply voltages approximately the same as each of the partitioned threshold voltages. In the present example, the bus comprises 16 power lines with voltages being 0.4, 0.6, 0.8, 1.0, 1.2, 1.4, 1.6, 1.8, 2.0, 2.2, 2.4, 2.6, 2.8, 3.0, 3.2, and 3.4V.

When the cell 50 is to be programmed to a target state $S_1$, the data is stored in a data latch 232. A voltage selector 230, responsive to the target state data $D(S_1)$ (which may be multiple bits) in the data latch 232, selects one of the bus line voltages, $V_0(S_1)$ which is optimized for programming the cell to the target state $S_1$.

As described earlier, programming is accomplished by alternately applying a programming pulse to the cell followed by reading back to determine the resultant memory state of the cell. During verify (read back) operations, the voltage $V_0(S_1)$ is applied to the cell's steering gate 60. During programming the voltage $V_0(S_1)$ forms the basis for constructing a programming voltage having a predetermined waveform profile. Depending on the desired programming rate, the waveform profile can be a flat one to increasing ones resulting in increasing rate of programming. In one preferred embodiment the predetermined waveform profile is a staircase waveform.

During a verify operation, a signal VERIFY enables a path 234 for $V_0(S_1)$ from the voltage selector 230 to be supplied to the steering gate 60 of the cell 50. The resultant source-drain current is compared to a reference current by a sense amplifier 240. Prior to the start of programming, the cell 50 is in an erased state where the source-drain current is larger than the reference current. As the cell 50 is progressively being programmed, charges accumulate on the floating gate thereby diminishing the field effect of the steering gate's $V_0(S_1)$ on the channel so that the source-drain current decreases until it drops below that of the reference current, $I_{REF}$ during verify. At that point the cell has been programmed to a desired level, and the event is signaled by an output signal PASSED* from the sense amplifier 240 going LOW.

During a programming operation, a multiphase program voltage generator 250 uses $V_0(S_1)$ to form the basis for generating various waveforms to be supplied to the steering gate 60 of the cell. The multiphase program voltage generator 250 generates different waveforms under different operating phases and is controlled by a cell program controller 260 that is responsive to the state of the local cell 50 as well as the states of all the cells in the group of k cells.

The cell program controller 260 is also responsive to the output signal of the sense amplifier 240. As described above, when the cell is programmed to a desired level, the sense amplifier's output signal, PASSED*, goes LOW which in turn causes the controller 260 to output a signal $PGM_1$* to enable a program inhibit circuit 280. When enabled, the program inhibit circuit 280 essentially inhibits the cell 50 from further programming by applying appropriate voltages to the drain and steering gates.

For programming k cells in parallel, a bank of multiphase programming circuits, 210, . . . , 210' is employed, one programming circuit for each cell. A parallel program controller 290, responsive to the status $PGM_1$*, . . . , $PGM_k$* from each of the k multiphase programming circuit cells, coordinates the programming operations of the bank of programming circuits. As will be described in more detail later, a new phase begins after all the k cells have been programmed to their respective desired levels, equivalent to each cell tripping its sense amplifier's reference current. This results in $PGM_1$* to $PGM_k$* all having become LOW.

Figure 5:
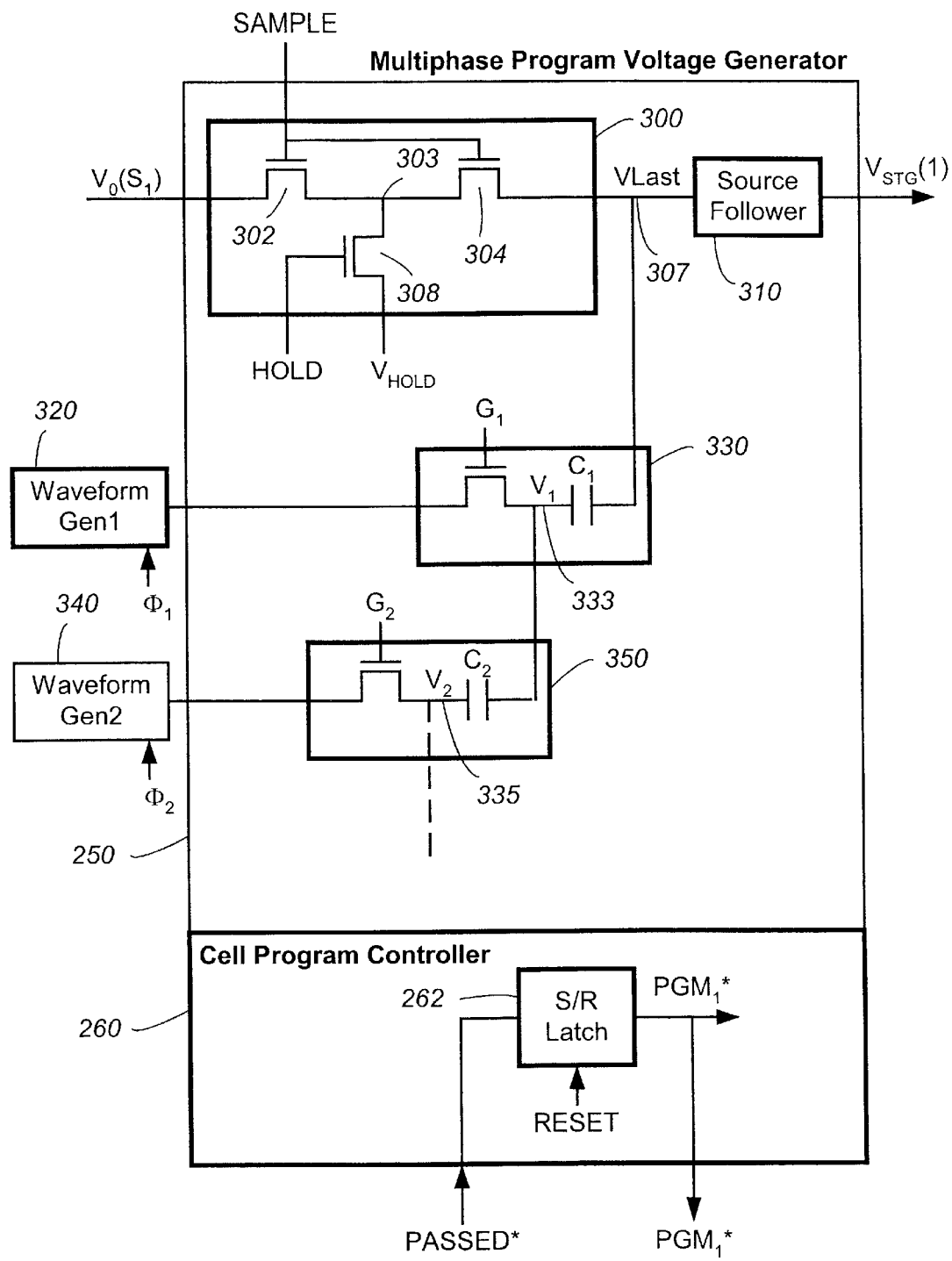
FIG. 5 shows in more detail the multiphase program voltage generator and the cell program controller of the multiphase programming circuit of FIG. 4.

FIG. 5 shows in more detail the multiphase program voltage generator 250 and the cell program controller 260 of the multiphase programming circuit 210 of FIG. 4. The operation of the various components is best described in combination with the timing diagrams shown in FIGS. 6–8.

Essentially, the multiphase program voltage generator 250, in an initial phase of the operation as designated by a control signal SAMPLE pulsing HIGH, samples and stores the optimized voltage $V_0(S_1)$ in a sample-and-hold circuit 300. The sample-and-hold circuit 300 has an output node 307 where voltages from other sources (such as 330, 350 to be described below) are summed to form a resultant voltage, VLast. This voltage, VLast, then drives a source follower 310 to provide the programming voltage $V_{STG}(1)$ at the steering gate of the cell 50.

The sample-and-hold circuit 300 comprises an input gated by two series transistors 302, 304 with a common node 303 in between and the output node 307. The common node 303 can be set to a voltage $V_{HOLD}$ gated by another transistor 308.

In the preferred embodiment, the other sources of voltages that are summed at the output node 307 to produce VLast are generated by a first-phase waveform generator 320 with an associated AC coupler 330 and a second-phase waveform generator 340 with an associated AC coupler 350.

Figure 6:
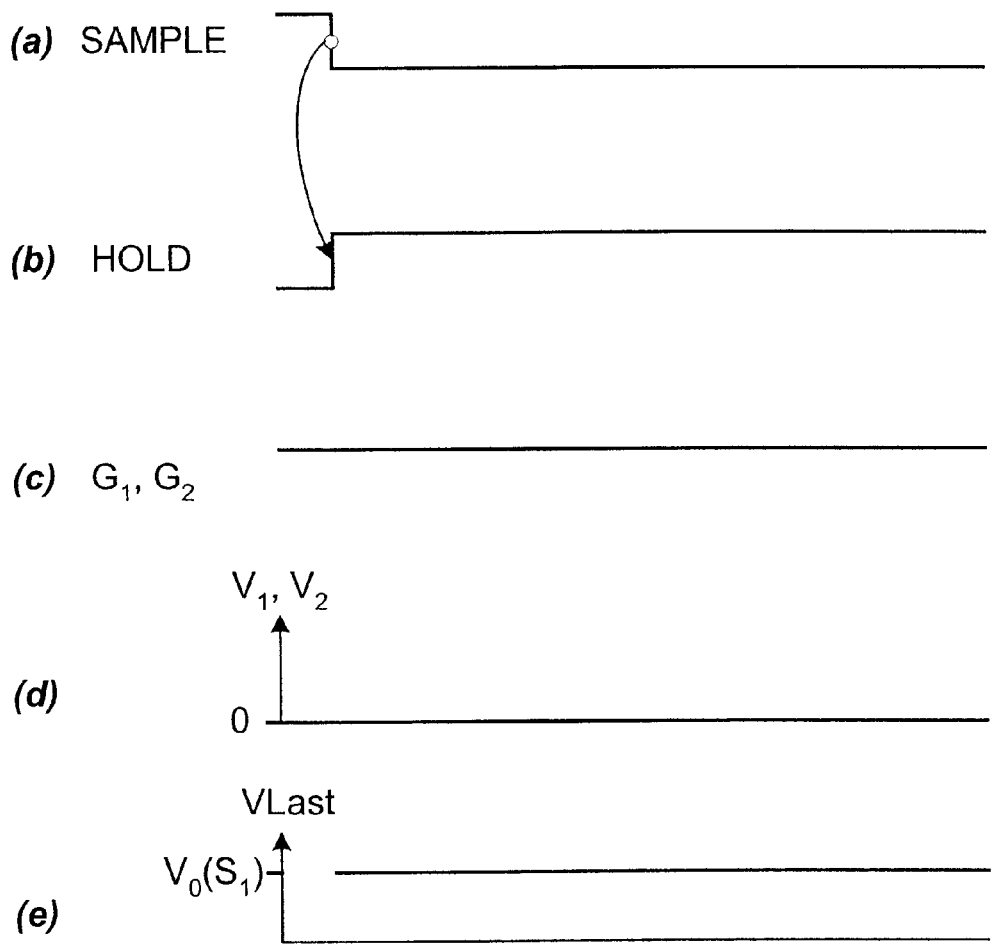
FIGS. 6(a)–6(e) are timing diagrams for the sample and hold operation of the multiphase program voltage generator of FIG. 5.

FIGS. 6(*a*)–6(*e*) are timing diagrams for the sample and hold operation of the multiphase program voltage generator of FIG. 5. In operation, the parallel program controller 290 (see FIG. 4) asserts the SAMPLE signal that turns on the two series transistors 302 and 304 to allow input voltage $V_0(S_1)$ to be sustained across a capacitor $C_1$ of the AC coupler 330. In the sample and hold operation, the waveform generators 320 and 340 do not contribute to Vlast as their paths are blocked by the gating signals $G_1$ and $G_2$ (FIG. 6(*c*)) respectively. Thus, the voltage, Vlast, at the output node 307 initially assumes the value of $V_0(S_1)$ (FIG. 6(*e*)). Thereafter, the two series transistors are turned off with SAMPLE going LOW (FIG. 6(*a*)) and the common node 303 is allowed to acquire the voltage $V_{HOLD}$ after a signal HOLD (FIG. 6(*b*)) is asserted on the gate of the transistor 308. This debiasing arrangement reduces the leakage of VLast back through transistor 304 by several orders of magnitude and ensures the accuracy of the sampled voltage stored at the node 307.

The cell program controller 260 shown in FIG. 5 comprises a Set/Reset latch 262. When the cell 50 has been programmed to have its conduction current below a reference current level, the sense amplifier outputs the signal PASSED* going from HIGH to LOW. This is used to set the set-reset latch 262 to change a latched output signal $PGM_1$* from HIGH to LOW, which in turn enables the program inhibit circuit 280.

Figure 7:
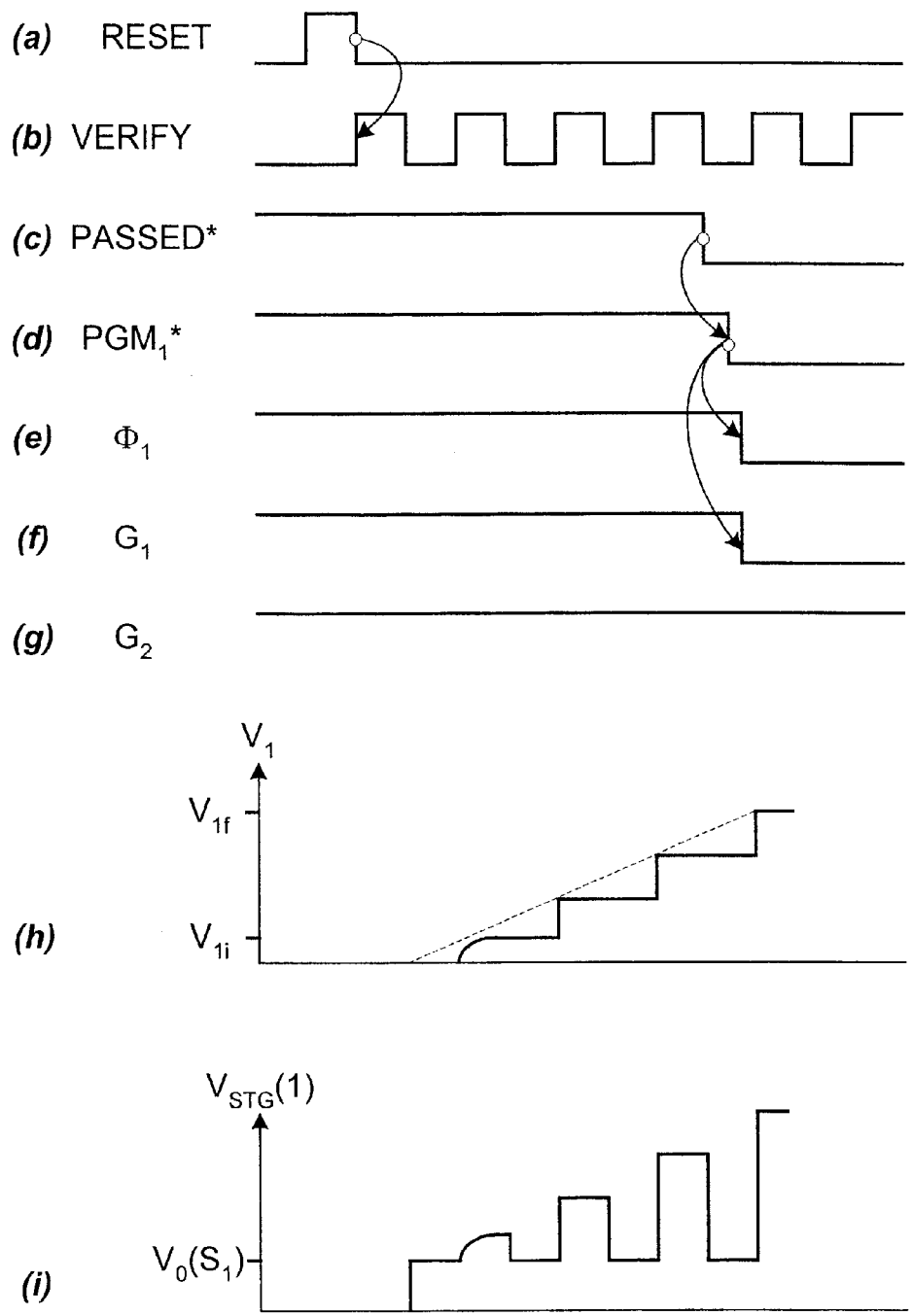
FIGS. 7(a)–7(i) are timing diagrams for the first phase's operation of the multiphase program voltage generator shown in FIG. 5.
Figure 8:
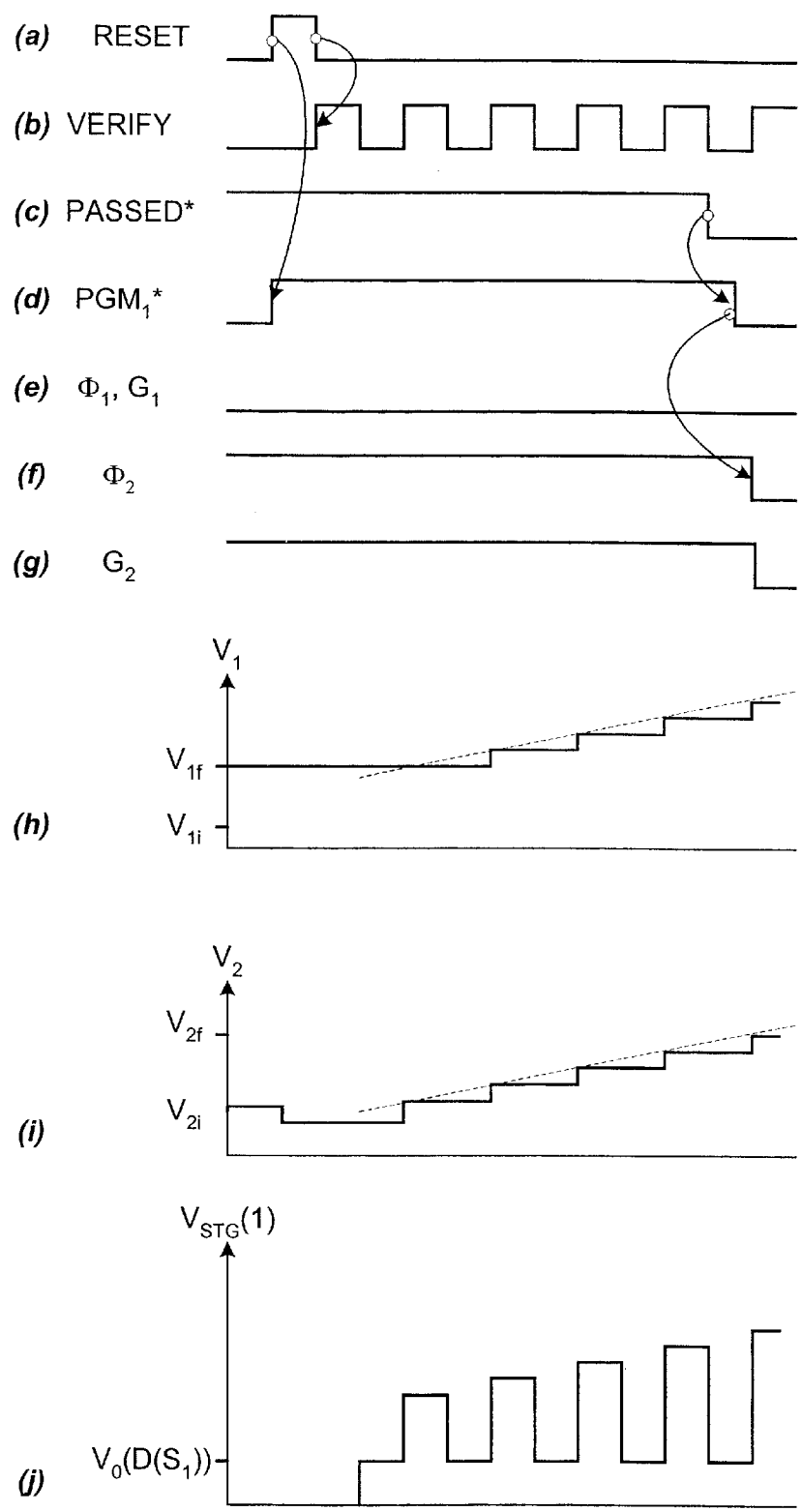
FIGS. 8(a)–8(j) are timing diagrams for the second phase's operation of the multiphase program voltage generator shown in FIG. 5.

FIGS. 7(*a*)–7(*i*) are timing diagrams for the first phase's operation of the multiphase program voltage generator shown in FIG. 5. In the preferred embodiment, a verify operation is performed prior to programming. A RESET signal resets the set-reset latch 262 so that the latched output signal $PGM_1$* is HIGH. A verify operation is enabled whenever the VERIFY signal goes HIGH. Conversely, a programming operation can take place when the VERIFY signal is LOW. If the cell 50 is properly erased, the sense amplifier 240's output signal PASSED* will be HIGH, which allows programming to take place because it will not activate the program inhibit circuit 280. (See also FIG. 4.)

During the first phase of the programming operation, the first waveform generator 320 is enabled by a control signal $\Phi_1$ (FIG. 7(e)) from the parallel program controller 290. It then generates $V_1(t)$ (FIG. 7(h)) in the form of one or more staircase pulses when the pass-gate signal $G_1$ is enabling. The initial rise of the first pulse is preferably ramped to moderate the otherwise steep rise thereby tempering any undesirable stress to the memory cell. Each successive pulse of the waveform will move the programmed level of the cell towards a target level, which is set to be a preferred level designating the target state for the cell. Because of the discrete nature of the programming steps, there will be a statistical distribution of programmed levels designated to be representing a given memory state. In the present embodiment, a cell is considered to be programmed to a given memory state when the programmed threshold level falls within the range of programmed levels associated with that state. The range of programmed levels is delimited at the low end by the target level and at the high end by the predetermined margin associated with that state.

In order to avoid overshooting the range of programmed levels, the programming circuit uses a predetermined level, short of the range, to gauge when to halt programming during each phase. This predetermined level is offset short of the target level such that when a programming pulse moves the programmed level past the predetermined level, it will not exceed the target level by more than the associated predetermined margin. In other words, once the predetermined level is passed, the cell is programmed to a level not exceeding the high end of the program level range for that state. In that event, the programming pulses of the current phase will no longer be applied. Thus, the considerations for the rate of increase of the staircase waveform and the first-phase predetermined level are as follows. The target level is approached with successive pulses as quickly as possible but no single pulse will cause the memory cells' threshold to pass both the first-phase predetermined level and the associated predetermined margin beyond the target level.

$V_1(t)$ is enabled at a node 333 by the control signal $PGM_1^*$ being HIGH and is added via the AC coupler 330 to the output node 307. (See FIGS. 7(d), 7(h).) Thus, the voltage at the output node 307 is $VLast=V_0(S_1)+b_1V_1(t)$ (where $b_1$ is a coupling ratio near unity) and it passes through the source follower 310 to become the voltage supplied to the steering gate of the cell 50. (See FIG. 7(i).) As programming pulses are successively applied, eventually, the cell 50 is programmed to the predetermined level for the first phase. At this point the signal PASSED* (FIG. 7(c)) goes LOW and in turn causes the signal $PGM_1^*$ to go LOW (FIG. 7(d)) which in turn enables the program inhibit circuit 280 to inhibit the cell 50 from further programming. At the same time, $PGM_1^*$ going LOW causes $G_1$ to go LOW (FIG. 7(f)), which cuts off the AC coupler 330 from the first waveform generator 320, thereby freezing $V_1$ at the amplitude of the waveform at the time of cutoff. If $T_{1f}$ is the time when $PGM_1^*$ goes LOW, then $V_1=V_1(T_{1f})$, so that $VLast\ (T_{1f})=V_0(S_1)+b_1V_1(T_{1f})$.

In the meantime, parallel programming for other cells in the chunk continues while more and more of the cells reach their associated first-phase predetermined level and drop out of the parallel programming operation. As each cell drop out, each of their associated VLast retains the corresponding voltage applied to the steering gate at the time of program inhibition. Eventually, all cells in the chunk become programmed to the corresponding predetermined levels and this event is signaled by $PGM_1^*$ to $PGM_k^*$ all having become LOW. This will prompt the parallel program controller 290 to initiate the next phase.

FIGS. 8(a)–8(j) are timing diagrams for the second phase's operation of the multiphase program voltage generator shown in FIG. 5. The second phase is similar to the first phase, starting with verify performed prior to programming, except the first waveform generator is disabled by the control signal $\Phi_1$ being LOW (FIG. 8(e)). Instead, the second waveform generator 340 is enabled by a control signal $\Phi_2$ (FIG. 8(f)) from the parallel program controller 290 and generates $V_2(t)$ in the form of one or more staircase pulses (FIG. 8(i)). Each successive pulse of the waveform will move the programmed level of the cell towards a second-phase predetermined level offset from the target level. The rate of increase of the staircase waveform and the second-phase predetermined level are such that the target level is approached with successive pulses as quickly as possible but no single pulse will cause the memory cells' threshold to pass both the second-phase predetermined level and the associated predetermined margin beyond the target level. In general the rate of increase of the staircase waveform and the predetermined level will be much finer than those of the first phase.

$V_2(t)$ is enabled at a node 335 by a reset control signal $PGM_1^*$ being HIGH (FIG. 8(d)) (with all the SR latches having been reset at the start of the second phase (FIG. 8(a)) and is added via the AC coupler 350 to the node 333. Thus, the voltage at the output node 307 is $VLast=V_0(S_1)+b_1[V_1(T_{1f})+b_2[V_2(t)-V_{2i}]$, where $b_2$ is another coupling ratio, and $V_{2i}$ is the value of $V_2$ when G1 goes LOW and is a predetermined offset (e.g.~-0.4V) applied before the end of the first phase. VLast passes through the source follower 310 to become the voltage supplied to the steering gate of the cell 50. (See FIG. 8(j).) As programming pulses are successively applied, eventually, the cell 50 is programmed to the predetermined level for the current phase. At this point the signal PASSED* (FIG. 8(c)) goes LOW and in turn causes the signal $PGM_1^*$ to go LOW (FIG. 8(d)) which in turn enables the program inhibit circuit 280 to inhibit the cell 50 from further programming. At the same time, $PGM_1^*$ going LOW causes $G_2$ to go LOW (FIG. 8(g)), which cuts off the AC coupler 350 from the second waveform generator 340 by disabling control signal $G_2$, thereby freezing $V_2$ at the amplitude of the waveform at the time of cutoff. If $T_{2f}$ is the time when $PGM_1^*$ goes LOW, then $V_2=V_2(T_{2f})$, so that $VLast\ (T_{2f})=V_0(S_1)+b_1V_1(T_{1f})+b_2[V_2(T_{2f})-V_{2i}]$.

Similarly, parallel programming for other cells in the chunk continues while more and more of the cells reach their target states and drop out of the parallel programming operation and each of their VLast retains the voltage applied to the steering gate at the time of program inhibition. Eventually, all cells in the chunk have been programmed to the predetermined level and this event is signaled by $PGM_1^*$ to $PGM_k^*$ all having become LOW. This will prompt the parallel program controller 290 to initiate the next phase.

Similar arrangement applies to higher phases, where a waveform generator produces a voltage that is added to the level of VLast frozen at the end of the previous phase. At the last phase, the predetermined level is the same as the target level corresponding to the target state.

In another embodiment, VLast is generated by one multiphase waveform generator.

The implementation of multiphase programming allows for different rates of increase of the staircase waveform during the different phases. The target state to be programmed is approached by a hierarchy of programming steps, with the first phase being the coarsest, approaching the target state in the fewest steps without over-shooting, then following by the next phase with a series of finer steps, again, approaching further the target state in the fewest steps without over-shooting, and so on. In this way, a series of increasing programming pulses is applied to the steering gate 60 of the cell 50, with the rate of increase during each phase being optimized for rapid convergence to the target state.

As described above, for each phase short of the final phase, a level short of the target state is used as the target, such that crossing it in a programming step for that phase will not lead to overshooting the actual target state. In the final phase, the target is the actual target state. In the preferred embodiment, the phase-dependent level is implemented by shifting down a predetermined amount the voltage applied to a steering gate $V_{STG}$ during the verify operation. This will result in the sense amplifier 240 (see FIG. 4) tripping before the actual target state is reached. The power source 222, (see FIG. 4), responsive to the state of the phase, adjusts the voltages on the multi-voltage bus 220 accordingly.

In an alternative embodiment, the phase-dependent verifying is accomplished by adjusting the reference current $I_{REF}$ employed by the sense amplifier 240, shown in FIG. 4, to incrementally lower values.

In yet another embodiment, the phase-dependent verifying is accomplished by a combination of shifting down a predetermined amount the voltage applied to the steering gate during the verify operation and adjusting the reference current employed by the sense amplifier.

A number of embodiments have been found to allow programming to converge to a target state within about 10–20 steps or so for a cell partitioned into 16 states. For example, one preferred embodiment has a two-phase programming operation, the first phase having a first increasing waveform followed by a second phase with a second more gently increasing waveform. Another embodiment has a three-phase operation with the first being a single pulse, followed by two series of staircase waveforms. Various combinations are possible and are contemplated by the invention.

One advantage of the programming system 200 described is even though a large group of cells are being programmed in parallel, the cells can all share the same power bus 220 to realize data-dependent programming voltages. Similarly, the phase-dependent waveform generators such as 320, 340, . . . are shared by all the cells in the group.

Figure 9:
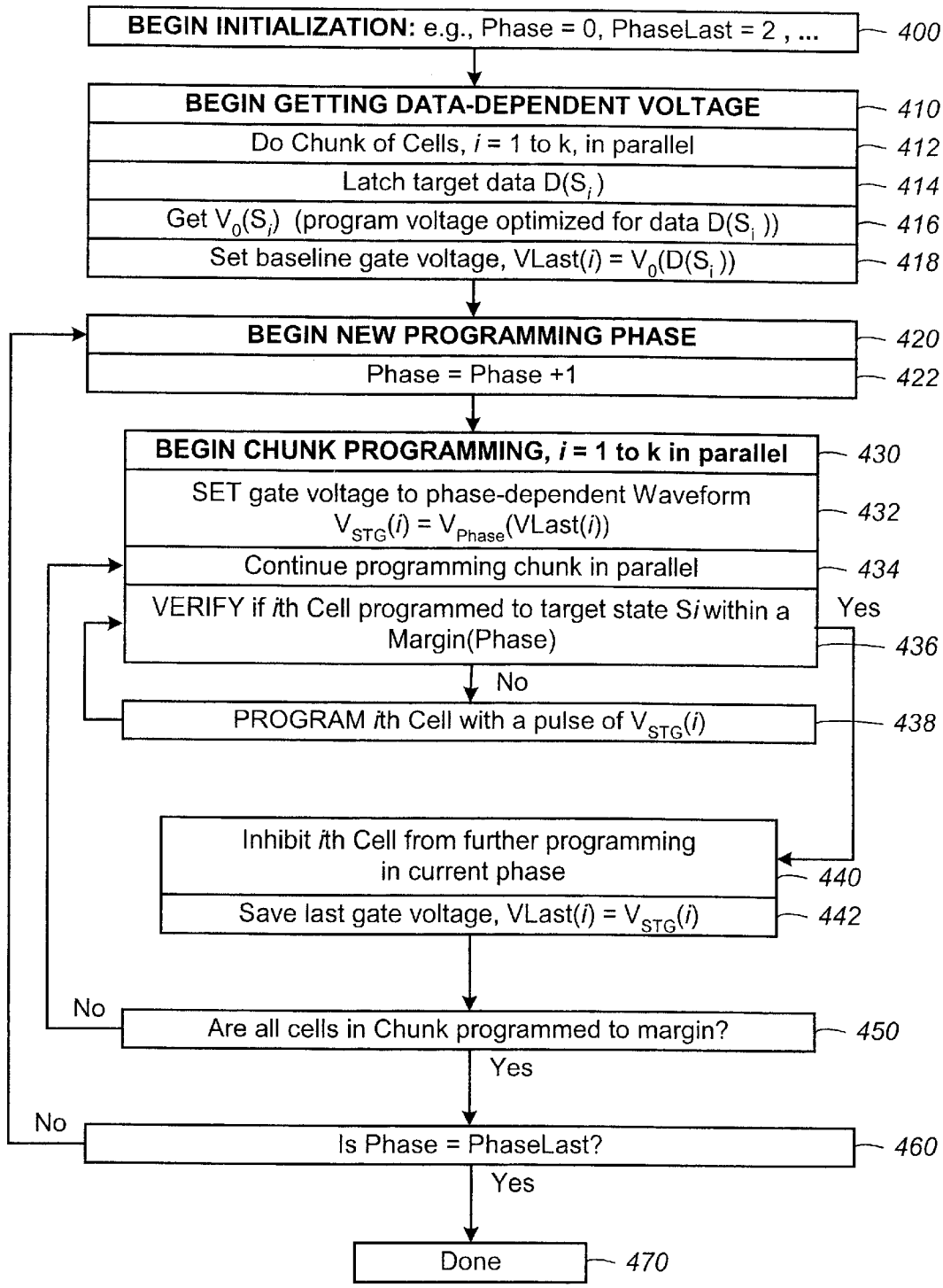
FIG. 9 is a flow diagram of the multiphase, parallel programming of a group of memory cells, according to a preferred embodiment of the present invention.

FIG. 9 is a flow diagram of the multiphase, parallel programming of a group of memory cells, according to a preferred embodiment of the present invention.

Step 400: BEGIN INITIALIZATION, Set Phase=0, PhaseLast=2 (as an example)

Step 410: BEGIN GETTING DATA-DEPENDENT VOLTAGE

Step 412: Do the chunk of cells, i=1 to k, in parallel

Step 414: Latch $D(S_i)$, the ith cell's target state.

Step 416: Use $D(S_i)$ to select an initial voltage, $V_0(D(S_i))$, optimized for programming the ith cell to $D(S_i)$.

Step 418: Store $V_0(D(S_i))$ to be used as a baseline voltage for the steering gate voltage, i.e., VLast(i)=$V_0(D(S_i))$.

Step 420: BEGIN NEW PHASE OF PARALLEL PROGRAMMING

Step 422: Phase=Phase+1

Step 430: BEGIN CHUNK PROGRAMMING, i=1 to k in parallel

Step 432: Set steering gate voltage to a phase-dependent waveform relative to the baseline VLast(i).

Step 434: Continue programming the chunk of cells in parallel.

Step 436: Verify to see if the ith cell has been programmed to within a predetermined level of the target state. The level is phase dependent and sufficiently short of the target state such that a programming step that crosses the level does not overshoot the target state. If the level has been passed, proceed to Step 440, if not continue to Step 438.

Step 438: Apply a programming pulse $V_{STG}(i)$ to the ith cell. Return to Step 436.

Step 440: Inhibit ith cell from further programming during the current phase.

Step 442: Store the current programming voltage, i.e. VLast(i)=$V_{STG}(i)$ as a baseline voltage for the next phase.

Step 450: Are all cells programmed past the level for the current phase? If that is the case, proceed to Step 460. Otherwise return to Step 434 to continue programming the remaining cells in the chunk until the last one has passed the level of the current phase. If programming has passed a predetermined maximum allowed number of pulses, a predetermined exception handling is initiated and where typically an error handling routine sets in.

Step 460: Is Phase=PhaseLast? If not, proceed to Step 420 to begin the next phase. Otherwise proceed to Step 470.

Step 470: DONE. Programming of the chunk of cells i=1 to k is completed.

The embodiments of the present invention have been discussed in reference to non-volatile semiconductor memory that contains a charge storing floating gate or dielectric layer. However, the various aspects of the present invention may be applied to any type of non-volatile memory where precise programming may be performed through the application of state-dependent, optimally controlled voltage programming pulses. For example, this methodology can be applied to multi-dielectric storage devices, such as Metal Nitride Oxide Silicon (MNOS) or Polysilicon Nitride Oxide Silicon (SONOS) devices. Similarly, it is applicable to MROM devices.

While the embodiments of this invention that have been described are the preferred implementations, those skilled in the art will understand that variations thereof may also be possible. Therefore, the invention is entitled to protection within the full scope of the appended claims.

What is claimed is:

1. A method of programming a group of memory cells in parallel, each memory cell having a charge storage individually programmable to a target charge level corresponding to a target memory state among a plurality of memory states thereof, comprising:

providing a plurality of voltage levels for programming a memory cell to one of said plurality of memory states;

selecting one of said plurality of voltage levels for each memory cell of the group, the selected voltage level being a function of the memory cell's target memory state;

generating a programming voltage as function of the selected voltage for each memory cell; and programming the group of memory cells in parallel.

2. A method as in 1, further comprising:

generating a programming voltage waveform for each cell of said group, each said programming voltage waveform having an initial amplitude which is a function of said voltage level selected for each cell.

3. A method as in 2, wherein said programming voltage waveform includes a series of voltage pulses.

4. A method as in 3, wherein applying an initial one of said series of voltage pulses programs each cell substantially towards but not overshooting its target memory state.

5. A method as in 3, wherein said series of voltage pulses has an amplitude that increases with time.

6. A method as in 3, further comprising:
   (a) programming said group of memory cells in parallel by applying to each cell a pulse from said series of voltage pulses of the programming voltage waveform associated with each cell;
   (b) verifying said group of memory cells in parallel by determining if each cell has been programmed to a predetermined level associated with the target state of each memory cell,
   (c) inhibiting any cell from said group from further programming when said any cell has been programmed to its predetermined level; and
   (d) repeating (a), (b) and (c) until all cells in said group have been programmed to their respective predetermined levels.

7. A method as in 6, wherein said repeating step also terminates when it has iterated more than a predetermined number of times.

8. A method as in 6, wherein said repeated cycling of (a)–(d) until termination constitutes one programming phase, and said method further comprises one or more additional programming phases, each with its associated series of voltage pulses and predetermined levels.

9. A method as in 8, wherein each successive phase employs a series of voltage pulses that produce a finer programming step from the previous phase.

10. A method as in 8, wherein each successive phase employs predetermined levels that are closer to the target states.

11. A method as in 8, wherein a predetermined last phase employs predetermined levels that have each cells of the group programmed to their respective target states.

12. A method as in 8, wherein each cell receives no more than twenty programming pulses.

13. A method as in anyone of claims 1–12, wherein each cell stores one of two memory states.

14. A method as in anyone of claims 1–12, wherein each cell stores more than two memory states.

15. A method as in anyone of claims 1–12, wherein each cell stores one of sixteen memory states.

16. A nonvolatile memory, comprising:
   an array of memory cells, each memory cell having a charge storage individually programmable to an associated target charge level corresponding to a target memory state among a plurality of memory states thereof;
   a power bus supplying a plurality of voltages in parallel for programming a memory cell to one of said plurality of memory states; and
   a parallel programming system for programming a group of memory cells in parallel, said parallel programming system having a plurality of programming circuits, one for each cell in the group, each programming circuit further comprising:
      a voltage selector selecting one of the plurality of voltages from said power bus, the selected voltage being a function of the target state of the associated memory cell such that the selected voltage is optimum for said programming circuit to produce a programming voltage for programming the memory state towards its target memory state.

17. A nonvolatile memory as in 16, wherein said programming circuit further comprising:
   a first programming voltage waveform generator coupled to receive said selected voltage to generate a first programming voltage waveform having an initial amplitude which is a function of the selected voltage;
   a sense amplifier for determining the programmed state of the memory cell; and
   a program inhibit circuit responsive to the sense amplifier for inhibiting further programming of the cell whenever the programmed state of the memory cell has passed a first predetermined level.

18. A non-volatile memory as in 17, further comprising:
   a storage element for saving the last programming voltage that causes the programmed state of the associated cell to pass the first predetermined level;
   a second programming voltage waveform generator responsive to said last programming voltage saved for generating a second programming voltage; and
   a controller for enabling said second programming voltage waveform generator after all memory cells in the group have passed the first predetermined level.

* * * * *